(12) United States Patent
Musiol

(10) Patent No.: US 12,507,380 B2
(45) Date of Patent: Dec. 23, 2025

(54) THERMALLY CONDUCTIVE CIRCUIT CARD GUIDES

(71) Applicant: Rockwell Collins, Inc., Cedar Rapids, IA (US)

(72) Inventor: Richard J. Musiol, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 183 days.

(21) Appl. No.: 18/239,570

(22) Filed: Aug. 29, 2023

(65) Prior Publication Data

US 2025/0081374 A1    Mar. 6, 2025

(51) Int. Cl.
*H05K 7/20* (2006.01)
*H05K 7/14* (2006.01)

(52) U.S. Cl.
CPC ....... *H05K 7/20545* (2013.01); *H05K 7/1404* (2013.01); *H05K 7/1412* (2013.01)

(58) Field of Classification Search
CPC ............ H05K 7/20545; H05K 7/1404; H05K 7/1412; H05K 7/20563
See application file for complete search history.

(56) References Cited

U.S. PATENT DOCUMENTS

| | | | |
|---|---|---|---|
| 8,854,818 B1 | 10/2014 | Angelucci | |
| 8,982,562 B2 | 3/2015 | Wahler et al. | |
| 10,080,311 B1 * | 9/2018 | Musiol | H05K 7/14 |
| 10,117,357 B2 | 10/2018 | Bai et al. | |
| 10,182,515 B2 | 1/2019 | Kusuda et al. | |
| 10,212,850 B1 * | 2/2019 | Wells | H05K 7/20545 |
| 2006/0043238 A1 | 3/2006 | Inam et al. | |
| 2006/0133033 A1 | 6/2006 | Straub et al. | |
| 2008/0037231 A1 * | 2/2008 | Damien | H05K 7/20545 |
| | | | 361/756 |

OTHER PUBLICATIONS

European Search Report received in EP Application No. 24195916.2, Feb. 6, 2025, 12 pages.

* cited by examiner

*Primary Examiner* — James Wu
(74) *Attorney, Agent, or Firm* — Sulter Swantz IP

(57) ABSTRACT

A system is disclosed for thermal coupling and fastening of circuit card assemblies of line-replaceable units (LRUs). The LRU may include a chassis configured to house one or more circuit card assemblies. The chassis may include external coupling features configured to receive fasteners. The circuit card assembly may include a heat sink with corresponding coupling features configured to align with the external coupling features and to receive the fasteners. The chassis may include a mateable surface. The circuit card assembly may include a corresponding mateable surface configured to mate to and thermally couple with the mateable surface of the chassis. The chassis may include an electrically conducting surface and the circuit card assembly may include a corresponding electrically conducting surface.

17 Claims, 4 Drawing Sheets

THERMALLY CONDUCTIVE CIRCUIT CARD GUIDES

TECHNICAL FIELD

The present disclosure relates generally to line-replaceable units (LRUs), and, more particularly, to systems and methods related to LRU chassis and/or circuit card assemblies installed (or configured to be installed) within the LRU chassis.

BACKGROUND

Line-replaceable units (LRUs) may contain multiple circuit cards installed in parallel using spring-finger card guides for alignment. For example, in an aircraft, if a certain part of the system fails—like a control device or navigation system—this part is designed as an LRU so it can be quickly replaced with a functional one, reducing the downtime of the aircraft and increasing the efficiency of maintenance operations.

Ever-increasing processing demands of modern electronics may drive LRU power densities beyond the guidelines of ARINC-600. Increasing power density of electronic devices are driving larger and larger heat sinks to dissipate the heat given limited cooling air allocations in aircraft electronics equipment bays.

Mechanical devices and convection-based (e.g., air flow based) heat sinks are sometimes used to facilitate heat dissipation of the circuit cards. For example, mechanical devices (e.g., Wedgelocks) inside the LRU chassis which lock a circuit card into a cold wall of a chassis and provide clamping force to facilitate conductive heat transfer and resist displacement due to shock or vibration may be used.

SUMMARY

A system is disclosed in accordance with one or more illustrative embodiments of the present disclosure. In one illustrative embodiment, the system may include a line-replaceable unit (LRU). In another illustrative embodiment, the LRU may include a chassis configured to house one or more circuit card assemblies disposed along a first direction. In another illustrative embodiment, the chassis may include outer surfaces comprising a first outer surface and a second outer surface opposite the first outer surface. In another illustrative embodiment, the chassis may include external coupling features configured to receive fasteners. In another illustrative embodiment, the circuit card assembly may include corresponding coupling features configured to align with the external coupling features and to receive the fasteners.

In a further aspect, the chassis may include a mateable surface. In another illustrative embodiment, the circuit card assembly may include a corresponding mateable surface configured to mate to and thermally couple with the mateable surface of the chassis. In another illustrative embodiment, the chassis may include an electrically conducting surface. In another illustrative embodiment, the circuit card assembly may include a corresponding electrically conducting surface configured to align with and electrically couple with the electrically conducting surface when the circuit card assembly is coupled to the chassis.

In a further aspect, the circuit card assembly may include a heat sink. In another illustrative embodiment, the circuit card assembly may be configured to be guided into the chassis and secured in place via the heat sink. In another illustrative embodiment, the chassis may include vents defined by the outer surfaces and configured to receive air for convectively cooling the heat sink. In another illustrative embodiment, the heat sink may include a corresponding mateable surface configured to mate to and thermally couple with a mateable surface of the chassis. In another illustrative embodiment, the corresponding coupling features may be threaded holes defined by the circuit card assembly.

A chassis is disclosed in accordance with one or more illustrative embodiments of the present disclosure. In one illustrative embodiment, the chassis may be configured to house one or more circuit card assemblies disposed along a first direction. In another illustrative embodiment, the chassis may include outer surfaces comprising a first outer surface and a second outer surface opposite the first outer surface. In another illustrative embodiment, the first outer surface may be facing outwards towards a second direction orthogonal to the first direction and the third direction. In another illustrative embodiment, the chassis may include a circuit card assembly configured to be removably insertable into the chassis. In another illustrative embodiment, the chassis may be configured to be removably coupled to the one or more circuit card assemblies via fasteners externally installable to the chassis. In another illustrative embodiment, at least one of the outer surfaces of the chassis may include external coupling features configured to receive the fasteners.

A method is disclosed in accordance with one or more illustrative embodiments of the present disclosure. In one illustrative embodiment, the method may include coupling a chassis of a line-replaceable unit (LRU) to a circuit card assembly of the LRU. In another illustrative embodiment, the coupling may include inserting fasteners into the chassis from outer surfaces of the chassis. In another illustrative embodiment, the LRU may include the chassis configured to house one or more circuit card assemblies disposed along a first direction. In another illustrative embodiment, the chassis may include outer surfaces comprising a first outer surface and a second outer surface opposite the first outer surface. In another illustrative embodiment, the circuit card assembly may be configured to be removably insertable into the chassis. In another illustrative embodiment, the circuit card assembly and the chassis may be each configured to be removably coupled to each other via fasteners externally installable to the chassis. In another illustrative embodiment, at least one of the outer surfaces of the chassis may comprise external coupling features configured to receive the fasteners. In another illustrative embodiment, the circuit card assembly may comprise corresponding coupling features configured to align with the external coupling features and to receive the fasteners.

In a further aspect, the chassis may include a mateable surface, and the circuit card assembly may include a corresponding mateable surface configured to mate to and thermally couple with the mateable surface of the chassis. The mateable surface and the corresponding mateable surface may be angled normal to a non-zero angle and define a thermal interface. In another aspect, the external coupling features may be angled at a non-zero angle such that the fasteners may be configured to be installed along the non-zero angle, wherein the non-zero angle may be defined as non-zero relative to both the first direction and the second direction. In another aspect, the non-zero angle may be between 20 and 40 degrees relative to the second direction. In another aspect, the chassis may include an electrically conducting surface, wherein the circuit card assembly may include a corresponding electrically conducting surface configured to align with and electrically couple with the electrically conducting surface when the circuit card assembly is coupled to the chassis.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims.

DETAILED DESCRIPTION

Figure 1A:
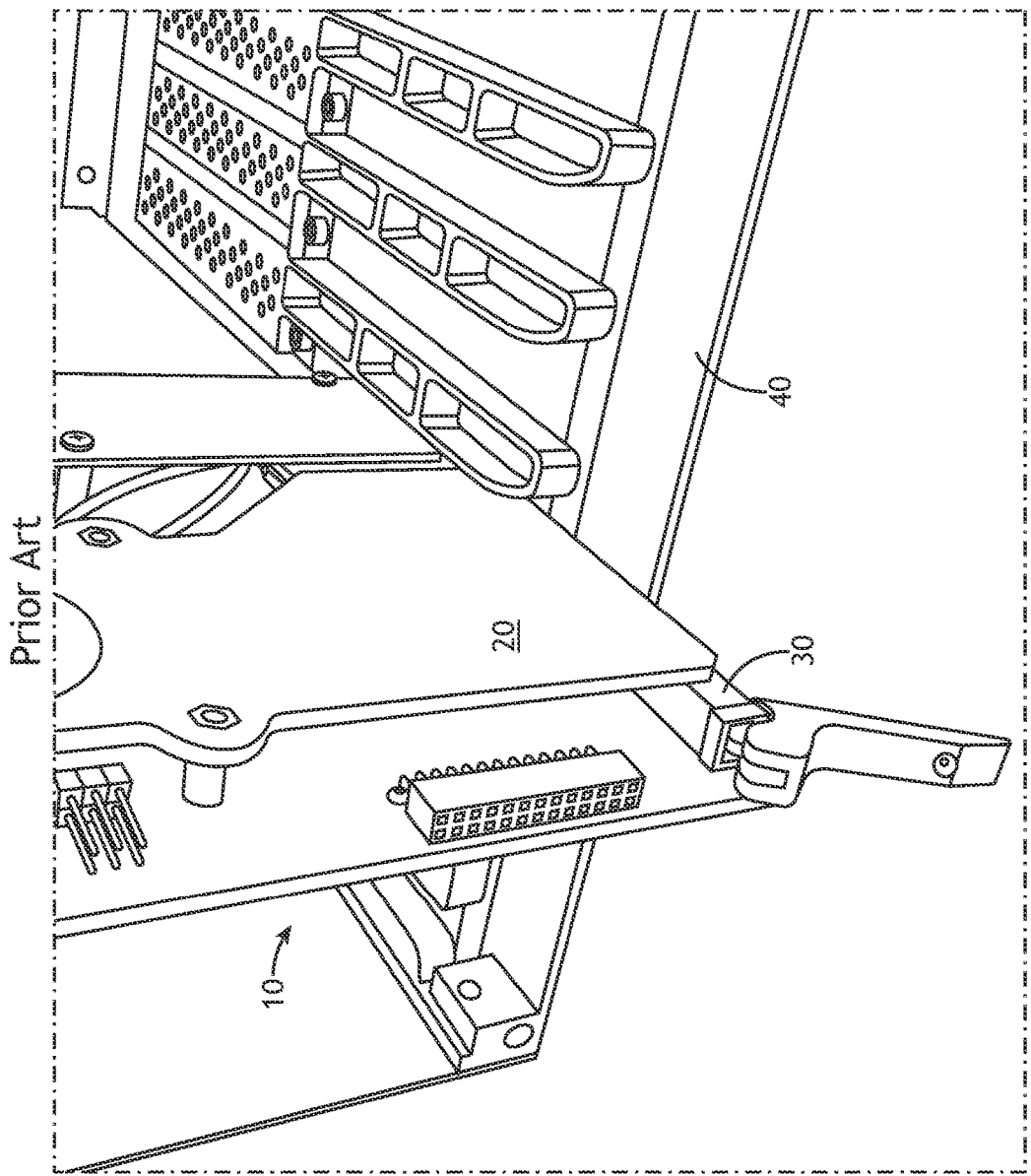
FIG. 1A is a three-dimensional view of a mechanical device for conductive heat transfer of a circuit card.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

At least some existing issues of at least some methods of installing LRUs may include labor-intensive installation, poor dimensional alignment, preload stress due to stack-up tolerances causing circuit card bending, expensive specialized components, and/or supply chain issues of specialized components.

Broadly speaking, embodiments of the inventive concepts disclosed herein are directed to a system for securely fixing circuit cards in place in a LRU chassis using angled externally-accessible fasteners. Embodiments may also include electrically grounding surfaces configured to contact a circuit card assembly and electrically ground when the fasteners are tightened. This approach provides a modular system that is relatively simple to install (e.g., doesn't necessarily need difficult-to-access internal fasteners) and efficiently cools LRUs without needing to necessarily rely on internal wedging components (e.g., Wedgelocks) inside the chassis. This may save significant costs and improve the reliability of installing LRUs.

One issue with installing many parallel circuit cards in an LRU chassis (e.g., frame) is that it may be impractical to reach into the chassis to install horizontal fasteners to hold all the circuit cards in place due to space constraints of tightly packed circuit cards.

Other methods and systems (e.g., designs not necessarily a focus of this disclosure) may make electrical contact with the chassis 40 at discrete points every inch or so using spring fingers, which may also aide in alignment. Previous methods in the art may rely on riveting the spring fingers to the chassis, which may be labor-intensive to perform. These methods may substantially rely on convective heat transfer to the surrounding air to dissipate heat and not make efficient use of the additional mass and surface area afforded by the chassis components. Additionally, in some air-cooled LRU's use in the art, much of the cooling air may simply pass through the chassis, without substantially flowing across the heat sinks or any other hot component, reducing overall cooling efficiency.

For designs of chassis that only need to hold two circuit cards, each inner side wall of the chassis may be used to dissipate heat by directly mounting each of the two circuit cards to an inner side wall of the chassis. However, this approach does not address heat dissipation of chassis with more than two circuit cards, where one or more circuit cards are in the middle, away from the inner side walls of the chassis. Some designs with additional circuit cards in the middle of the chassis box have used wedging components (e.g., Wedgelocks or the like), rather than internal fasteners, to drive the heat into the chassis. An external component (e.g., handle) may be used to cause the wedge to widen internally and wedge the circuit cards into place, providing a tight friction coupling with the chassis. These designs may allow better ease of access than internal horizontal fasteners and the wedging components may allow some heat dissipation (although not necessarily enough for relatively higher heat loads). However, wedging components may be relatively expensive and can be difficult to tighten properly. For example, in at least some instances in industry, additional operator training is used just to ensure that wedging components are properly installed for in-process build inspections. This additional effort for special components may increase training and labor costs.

As noted, at least some issues of at least some methods of installing LRUs may include labor-intensive installation, poor dimensional alignment, preload stress due to stack-up tolerances causing circuit card bending, expensive specialized components, and/or supply chain issues of specialized components.

Therefore, it is contemplated herein that there may exist a desire for a system and method for installing LRUs that overcomes these difficulties.

Embodiments may include machined rails in the top and bottom of the LRU chassis at about a 60-degree angle (e.g., mating surfaces at a more vertical angle), with the mating surfaces machined into heatsinks that carry the circuit boards. Fasteners (e.g., screws) installed at a 30-degree angle from the outside of the LRU and embedded in the chassis may provide the necessary thermal contact pressure and force the heatsink into the chassis firmly providing structural rigidity and thermal coupling. Angling the screws from the outside allows them to be accessed without disturbing any other circuit cards for ease of LRU assembly and maintenance (e.g., without needing to reach into the chassis to de-couple/unscrew a fastener). The firmly mated angled surfaces create a thermal interface that allows the LRU chassis to act as a secondary heatsink. The firmly mated angled surfaces may also form a natural barrier (e.g., air seal, air deflector, and/or the like) for focusing LRU cooling air on a heat sink (e.g., on heat sink fins) thereby increasing heat sink effectiveness. Utilizing the chassis as a secondary heatsink allows for higher LRU heat loads and/or lower weight.

Soft fabric-over-foam gaskets may be used in place of metal spring fingers to provide an electrical ground for the circuit card and may be positioned such that they are compressed when the fasteners are tightened. The fabric mesh may provide a nearly continuous contact patch along the circuit card rather than, for example, a half-dozen discrete points provided by spring fingers.

First, FIG. 1A of a wedging mechanical device is discussed below, and then, in contrast, systems and methods configured for externally accessible fasteners and other limitations are discussed.

FIG. 1A illustrates a three-dimensional view of an LRU 10 including a mechanical device 30 for conductive heat transfer of a heat sink 20 to a chassis 40. The LRU 10 of FIG. 1A may suffer from at least some of the issues noted above (e.g., specialized training causing labor-intensive installation, specialized components causing relatively higher inventory costs, etc.).

In FIG. 1A, the circuit card is thermally and physically coupled to the mechanical device 30 and to a heat sink 20. The mechanical device 30 is used to secure the circuit card in place. This configuration may also use spring fingers (not shown) (e.g., flexible electrically conducting surfaces that are configured to flexibly contact the LRU 10 when it is installed) to allow electrical coupling (e.g., grounding) to the chassis 40.

Figure 1B:
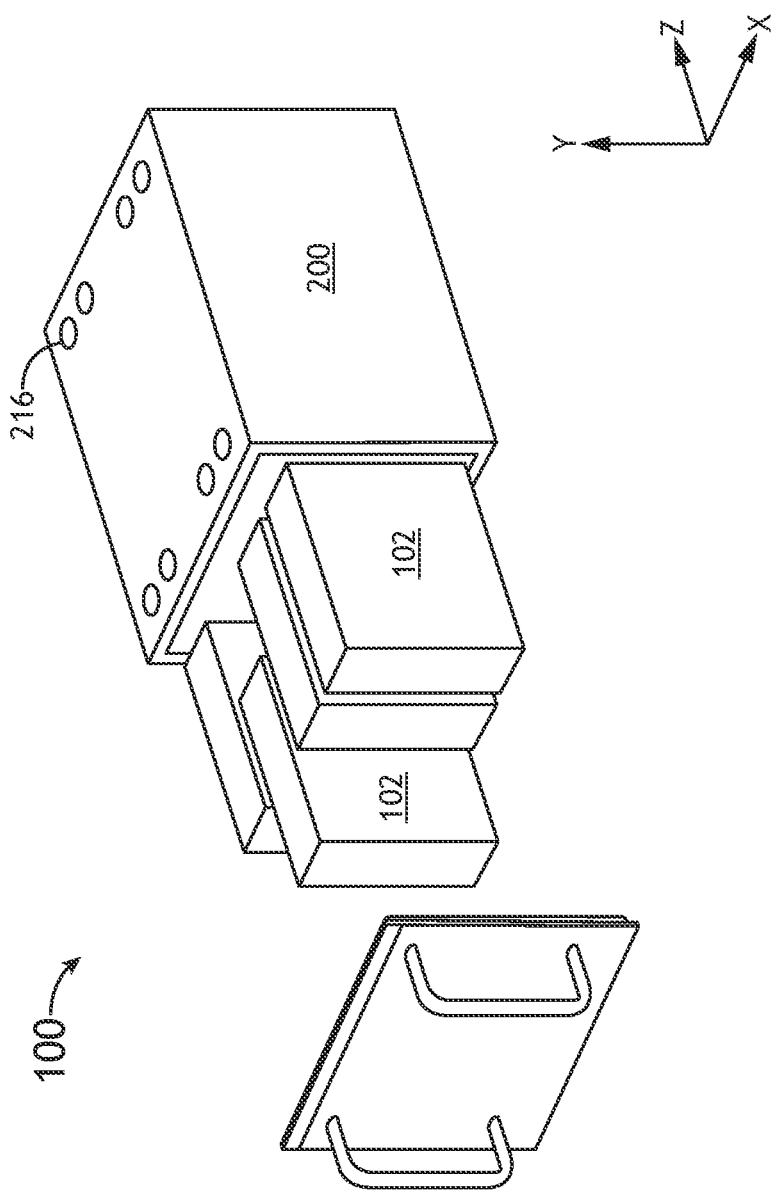
FIG. 1B is a three-dimensional view of circuit cards being inserted into a chassis, in accordance with one or more embodiments of the present disclosure.

FIG. 1B illustrates a (simplified) three-dimensional view of an LRU 100 with circuit card assemblies 102 being inserted into a chassis 200 (i.e., frame of an LRU 100) utilizing external coupling features 216, in accordance with one or more embodiments of the present disclosure.

The circuit card assembly 102 may be installed (or be configured to be installed) into a chassis 200. The circuit card assembly 102 may include at least some circuits (e.g., circuit cards, logic gates, transistors, motherboards, and/or the like) or be configured to receive a circuit card. The circuit card assembly 102 may include elements such as a heat sink, defined mateable surfaces, various fasteners, and/or the like.

Figure 1C:
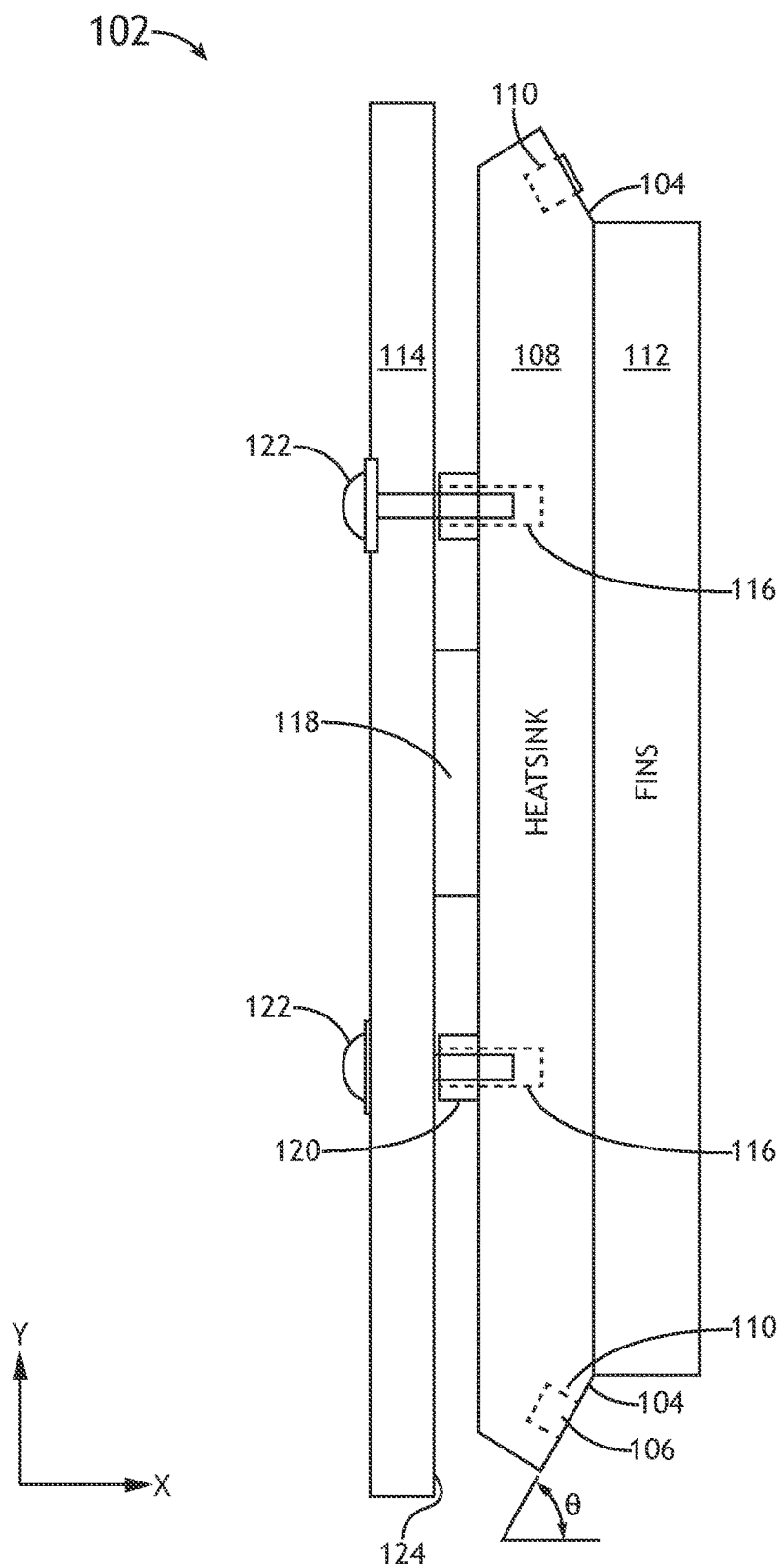
FIG. 1C is a front view of a circuit card assembly, in accordance with one or more embodiments of the present disclosure.
Figure 2:
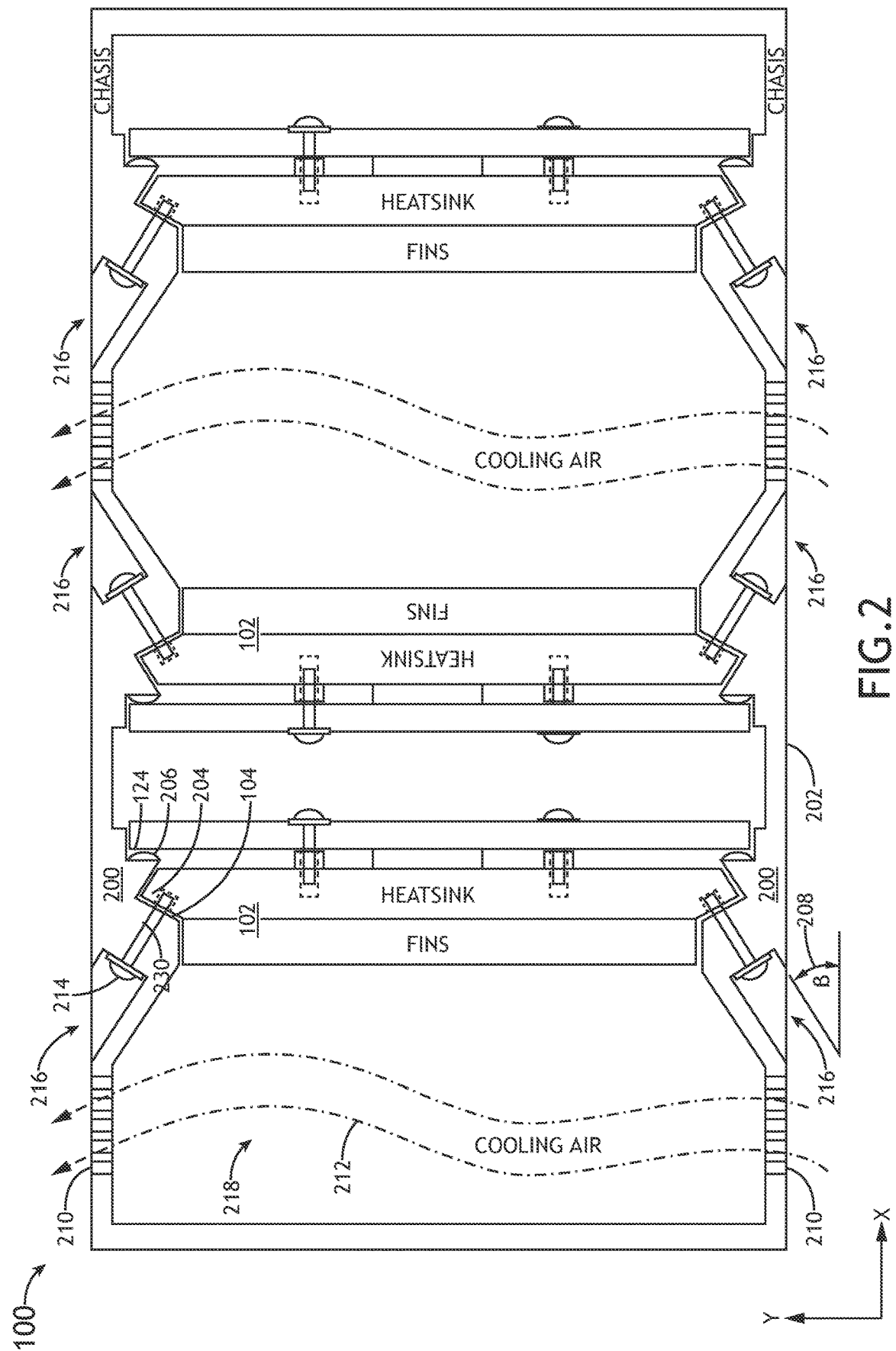
FIG. 2 is a front view of a set of circuit card assemblies inserted into the chassis, in accordance with one or more embodiments of the present disclosure.

Referring to FIGS. 1C and 2, the circuit card assembly 102 and the chassis 200 of the LRU 100 are discussed in detail according to one or more embodiments of the present disclosure. FIG. 1C illustrates a front view of a circuit card assembly 102, in accordance with one or more embodiments of the present disclosure. FIG. 2 illustrates a front view of a set of circuit card assemblies 102 inserted into a chassis 200, in accordance with one or more embodiments of the present disclosure.

A system 100 may include an LRU 100. The LRU 100 may, but is not necessarily required to, include the circuit card assembly 102 and/or the chassis 200. The circuit card assembly 102 may be configured to be removably insertable into the chassis 200. Each circuit card assembly 102 may be configured to be received by the chassis 200 along a third direction (e.g., a Z-direction orthogonal to the X-direction and the Y-direction).

The chassis 200 may be configured to house one or more circuit card assemblies 102 disposed along a first direction (e.g., disposed in a row along the X-direction). For example, the circuit card assemblies 102 may be configured to be substantially aligned (e.g., parallel and vertically aligned) next to each other in a stacked row. For example, the chassis 200 may include one or more rails configured to receive the circuit card assemblies 102. For each circuit card assembly 102, the chassis 200 may include two machined rails, each machined rail including a mateable surface 204, where each mateable surface 204 is disposed on opposing internal surfaces (e.g., inner top and inner bottom surface) of the chassis 200. The mateable surface 204 may be asymmetrical in shape as shown in the front view of FIG. 1C individually, but symmetrically orientated relative to each other relative to a dividing plane (not shown) defined by the first and third direction (e.g., X-direction and Z-direction). In other words, in a sense, each pair of mateable surfaces 204 may include one mateable surface 204 in a symmetrically flipped orientation relative to the (other) mateable surface 204. The mateable surfaces 204 may be substantially uniform in cross-sectional shape as shown along the third direction (e.g., Z-direction). For example, the mateable surfaces 204 may be part of a machined rail and be configured for smooth guidable insertion and alignment as well as continuous thermal coupling of the circuit card assembly 102 along the machined section of the machined rail.

The features (e.g., machined rails, mateable surface 204, etc.) that are configured to receive each circuit card assembly 102 may alternate in orientation around the third direction, as shown in FIG. 1C, to allow for the heat sinks 108 of adjacent circuit card assemblies 102 to face each other. In other words, each pair of top and bottom mateable surfaces 204, may, in a sense, be flipped horizontally so that every other circuit card assembly 102 needs to be rotated 180 degrees when inserted. Such an orientation may allow for maximizing thermal cooling using the cooling air 212, enabling a single column of cooling air 212 to cool two opposing heat sinks 108 simultaneously.

The chassis 200 may include outer surfaces 202 comprising a first outer surface 202 (e.g., top surface) and a second outer surface 202 (e.g., bottom surface) opposite the first outer surface 202. The first outer surface 202 may face outwards towards a second direction (e.g., upwards towards a positive Y-direction) orthogonal to the first direction and the third direction.

The circuit card assembly 102 and the chassis 200 may each be configured to be removably coupled to each other via fasteners 214 that may be externally installable to the chassis 200. For instance, the fasteners 214 could be screws, bolts, or any other suitable fastening devices. The removable coupling allows for easy maintenance and replacement of the circuit card assembly 102.

At least one of the outer surfaces 202 (e.g., the top and/or bottom surface) of the chassis 200 may include external coupling features 216 configured to receive the fasteners 214. For example, both the first outer surface 202 and the second outer surface 202 may each include external coupling features 216. These features may include slots, voids, countersunk holes, and/or any other suitable structures for receiving the fasteners 214, such as a hole defined by outer surface 202 configured to allow a fastener 214 to couple to the circuit card assembly 102. For instance, the external coupling features 216 may include an inner hole 230 (e.g., cylindrical and/or bolt hole) configured to receive a fastener 214. The inner hole 230 may be aligned at the non-zero angle 208.

The circuit card assembly 102 may include corresponding coupling features 110 configured to align with the external coupling features 216 and to receive the fasteners 214. For instance, the corresponding coupling features 110 on the circuit card assembly 102 may be holes, threaded holes, slots or the like that align with the external coupling features 216 on the chassis 200 when the circuit card assembly 102 is inserted into the chassis 200.

The chassis 200 may include a mateable surface 204, and the circuit card assembly 102 may include a corresponding mateable surface 104. The corresponding mateable surface 104 may be configured to mate to and thermally couple with the mateable surface 204 of the chassis 200. The mateable surface 204 and the corresponding mateable surface 104 may be angled normal to a (mating) non-zero angle 106 (i.e., θ) and define a thermal interface and mating interface.

The external coupling features 216 may be angled at a non-zero angle 208 (e.g., β) such that the fasteners 214 may be installed along the non-zero angle 208. The non-zero angle 208 may be orthogonal (i.e., 90 degrees) to the (mating) non-zero angle 106.

The non-zero angle 208 may be defined as non-zero relative to both the first direction and the second direction. For instance, the non-zero angle 208 may be 30 degrees, which may facilitate the installation of the fasteners 214 and enhance the stability of the coupling between the circuit card assembly 102 and the chassis 200, and which may provide a balance between ease of installation of the fasteners 214 and stability of the coupling.

The non-zero angle 208 may be between 10 and 60 degrees relative to the second direction. For instance, the non-zero angle 208 may be between 20 and 40 degrees relative to the second direction. This angle range reduces lateral movement (e.g., movement in Y-direction) when tightening the fasteners 214 compared to a lower range. This angle range may correspond to a (mating) non-zero angle 106 of 50 to 70 degrees.

The non-zero angle 208 may be, but is not necessarily required to be, coplanar to the cross-section of the chassis 200, such as being between 5 degrees and −5 degrees relative to a plane defined as coplanar with the first direction and the second direction.

The chassis 200 may include an electrically conducting surface 206. The circuit card assembly 102 may include a corresponding electrically conducting surface 124 configured to align with and electrically couple with the electrically conducting surface 206 when the circuit card assembly 102 is coupled to the chassis 200. For example, the electrically conducting surfaces 206, 124 could be made of metal or any other suitable electrically conductive material. This could provide an electrical connection between the circuit card assembly 102 and the chassis 200, which could be useful for grounding or other purposes. Alternatively, and/or in addition, the electrically conducting surface 206 may include (soft) fabric-over-foam gaskets.

The circuit card assembly 102 may include a heat sink 108. For instance, the heat sink 108 could be made of a thermally conductive material, such as metal, to efficiently dissipate heat generated by the circuit card assembly 102. For instance, the heat sink 108 may include a plate of metal. The heat sink 108 may be physically coupled to the circuit card using circuit card fasteners 122 and circuit card fastener receiving features 116 (e.g., threaded holes). The heat sink 108 may included one or more extending members 120 to offset a circuit card 114 from the heat sink 108 by a distance roughly equal to the thickness of a heat producing component 118 (e.g., CPU chip, GPU chip, and/or the like). In some embodiments, a circuit card assembly 102 does not necessarily include a circuit card 114, and may be configured to receive a circuit card 114.

The circuit card assembly 102 may be configured to be guided into the chassis 200 and secured in place via the heat sink 108.

The chassis 200 may include vents 210 defined by the outer surfaces 202 and configured to receive air 212 for convectively cooling the heat sink 108. For instance, the vents 210 could be arranged and/or positioned to direct cooling air 212 over the heat sink 108 to enhance the cooling efficiency.

The heat sink 108 may include a corresponding mateable surface 104 configured to mate to and thermally couple with a mateable surface 204 of the chassis 200. For example, the corresponding mateable surface 104 on the heat sink 108 could be shaped to closely fit with the mateable surface 204 on the chassis 200, enhancing the thermal coupling between the heat sink 108 and the chassis 200. For instance, the corresponding mateable surface 104 and the mateable surface 204 may include any shape, such as respective flat surfaces.

The corresponding coupling features 110 may be (or include) threaded holes defined by the circuit card assembly 102. For instance, the threaded holes may be configured to receive screws or other threaded fasteners 214, providing a secure and removable coupling between the circuit card assembly 102 and the chassis 200.

In embodiments, a method may be used. The method may include a step for coupling a chassis 200 of a line-replaceable unit (LRU) 100 to a circuit card assembly 102 of the LRU 100. The coupling may include inserting fasteners 214 into the chassis 200 from outer surfaces 202 of the chassis 200. The chassis 200 and the circuit card assembly 102 of such a method may be performed using any embodiment disclosed of the present disclosure. For example, the method may be a product by process of embodiments herein.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "in embodiments", "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed:

1. A system comprising:
    a line-replaceable unit (LRU), the LRU comprising:
        a chassis configured to house one or more circuit card assemblies disposed along a first direction, wherein each circuit card assembly is configured to be received along a third direction, the chassis comprising:
            outer surfaces comprising a first outer surface and a second outer surface opposite the first outer surface, wherein the first outer surface is facing outwards towards a second direction orthogonal to the first direction and the third direction; and
        a circuit card assembly of the one or more circuit card assemblies, wherein the circuit card assembly is configured to be removably insertable into the chassis, wherein the circuit card assembly comprises a heat sink physically coupled to a circuit card,
        wherein the circuit card assembly and the chassis are each configured to be removably coupled to each other via fasteners externally installable to the chassis,
            wherein at least one of the outer surfaces of the chassis comprises external coupling features configured to receive the fasteners,
            wherein the heat sink of the circuit card assembly comprises corresponding coupling features configured to align with the external coupling features and to receive the fasteners,
            wherein the chassis comprises an electrically conducting surface, wherein the circuit card comprises a corresponding electrically conducting surface configured to align with and electrically couple with the electrically conducting surface when the circuit card assembly is coupled to the chassis using the fasteners, wherein the corresponding electrically conducting surface of the circuit card is structurally distinct and located separately from the heat sink.

2. The system of claim 1, wherein the chassis comprises a mateable surface, and wherein the circuit card assembly comprises a corresponding mateable surface configured to mate to and thermally couple with the mateable surface of the chassis;
    wherein the mateable surface and the corresponding mateable surface are angled normal to a non-zero angle and define a thermal interface.

3. The system of claim 1, wherein the external coupling features are angled at a non-zero angle such that the fasteners are configured to be installed along the non-zero angle, wherein the non-zero angle is defined as non-zero relative to both the first direction and the second direction.

4. The system of claim 3, wherein the non-zero angle is between 20 and 40 degrees relative to the second direction.

5. The system of claim 3, wherein the non-zero angle is between 5 degrees and −5 degrees relative to a plane defined as coplanar with the first direction and the second direction.

6. The system of claim 1, wherein the circuit card assembly is configured to be guided into the chassis and secured in place via the heat sink.

7. The system of claim 1, wherein the chassis comprises vents defined by the outer surfaces and configured to receive air for convectively cooling the heat sink.

8. The system of claim 1, wherein the heat sink comprises a corresponding mateable surface configured to mate to and thermally couple with a mateable surface of the chassis.

9. The system of claim 1, wherein the corresponding coupling features are threaded holes defined by the circuit card assembly.

10. A chassis configured to house one or more circuit card assemblies disposed along a first direction, wherein each circuit card assembly of the one or more circuit card assemblies is configured to be received along a third direction, the chassis comprising:
    outer surfaces comprising a first outer surface and a second outer surface opposite the first outer surface, wherein the first outer surface is facing outwards towards a second direction orthogonal to the first direction and the third direction; and
    a circuit card assembly configured to be removably insertable into the chassis, wherein the circuit card assembly comprises a heat sink physically coupled to a circuit card,
    wherein the chassis is configured to be removably coupled to the one or more circuit card assemblies via fasteners externally installable to the chassis,
        wherein at least one of the outer surfaces of the chassis comprises external coupling features configured to receive the fasteners,
        wherein the heat sink of the circuit card assembly comprises corresponding coupling features configured to align with the external coupling features and to receive the fasteners,
        wherein the chassis comprises an electrically conducting surface, wherein the circuit card comprises a corresponding electrically conducting surface configured to align with and electrically couple with the electrically conducting surface when the circuit card assembly is coupled to the chassis using the fasteners, wherein the corresponding electrically conducting surface of the circuit card is structurally distinct and located separately from the heat sink.

11. The chassis of claim 10, wherein the chassis comprises a mateable surface configured to mate to and thermally couple with a corresponding mateable surface of the circuit card assembly;

wherein the mateable surface and the corresponding mateable surface are angled normal to a non-zero angle and define a thermal interface.

12. The chassis of claim 10, wherein the external coupling features are angled at a non-zero angle such that the fasteners are configured to be installed along the non-zero angle, wherein the non-zero angle is defined as non-zero relative to both the first direction and the second direction.

13. The chassis of claim 12, wherein the non-zero angle is between 20 and 40 degrees relative to the second direction.

14. A method comprising:
coupling a chassis of a line-replaceable unit (LRU) to a circuit card assembly of one or more circuit card assemblies of the LRU, wherein the coupling comprises inserting fasteners into the chassis from outer surfaces of the chassis, wherein the LRU comprises:
the chassis configured to house the one or more circuit card assemblies disposed along a first direction, wherein each circuit card assembly of the one or more circuit card assemblies is configured to be received along a third direction, the chassis comprising:
the outer surfaces comprising a first outer surface and a second outer surface opposite the first outer surface, wherein the first outer surface is facing outwards towards a second direction orthogonal to the first direction and the third direction; and
the circuit card assembly configured to be removably insertable into the chassis, wherein the circuit card assembly comprises a heat sink physically coupled to a circuit card,
wherein the circuit card assembly and the chassis are each configured to be removably coupled to each other via the fasteners externally installable to the chassis,
wherein at least one of the outer surfaces of the chassis comprises external coupling features configured to receive the fasteners,
wherein the heat sink of the circuit card assembly comprises corresponding coupling features configured to align with the external coupling features and to receive the fasteners,
wherein the chassis comprises an electrically conducting surface, wherein the circuit card comprises a corresponding electrically conducting surface configured to align with and electrically couple with the electrically conducting surface when the circuit card assembly is coupled to the chassis using the fasteners, wherein the corresponding electrically conducting surface of the circuit card is structurally distinct and located separately from the heat sink.

15. The method of claim 14, wherein the chassis comprises a mateable surface, and wherein the circuit card assembly comprises a corresponding mateable surface configured to mate to and thermally couple with the mateable surface of the chassis;
wherein the mateable surface and the corresponding mateable surface are angled normal to a non-zero angle and define a thermal interface.

16. The method of claim 14, wherein the external coupling features are angled at a non-zero angle such that the fasteners are configured to be installed along the non-zero angle, wherein the non-zero angle is defined as non-zero relative to both the first direction and the second direction.

17. The method of claim 16, wherein the non-zero angle is between 20 and 40 degrees relative to the second direction.

* * * * *